United States Patent [19]

Vidusek et al.

[11] Patent Number: 5,403,685
[45] Date of Patent: Apr. 4, 1995

[54] LITHOGRAPHIC PROCESS FOR PRODUCING SMALL MASK APERTURES AND PRODUCTS THEREOF

[75] Inventors: David A. Vidusek, Camas, Wash.; Hiroki Tabuchi, Nara, Japan

[73] Assignees: Sharp Kabushiki Kaisha, Osaka, Japan; Sharp Microelectronics Technology, Inc., Camas, Wash.

[21] Appl. No.: 954,505

[22] Filed: Sep. 29, 1992

[51] Int. Cl.$^6$ ............................................. G03F 9/00
[52] U.S. Cl. ....................................... 430/18; 430/5; 430/14; 430/322; 430/324; 430/325; 430/328
[58] Field of Search ................... 430/18, 14, 324, 325, 430/328, 322, 5

[56] References Cited

U.S. PATENT DOCUMENTS

| | | | |
|---|---|---|---|
| 5,194,346 | 3/1993 | Rolfson et al. | 430/5 |
| 5,208,125 | 5/1993 | Lowrey et al. | 430/311 |
| 5,276,551 | 1/1994 | Nakagawa | 430/5 |

OTHER PUBLICATIONS

Tabuchi et al.; Novel 0.2 μm i-Line Lithograhy by Phase Shifting on the Substrate; 1991; IEDM; Technical Digest.

*Primary Examiner*—John Kight, III
*Assistant Examiner*—John M. Cooney, Jr.
*Attorney, Agent, or Firm*—Fliesler, Dubb, Meyer & Lovejoy

[57] ABSTRACT

Sub-micron features are defined photo-lithographically by combining phase-shifting techniques with conventional photo lithographic techniques. In a first step, phase-shifting edges are defined in a photoresist layer. Dark-bands develop at the phase-shifting edges due to wavefront interference of an illuminating radiation in a subsequent exposure step. Development leaves behind sub-micron sections of photoresist which were covered by the dark-band regions. The dark-band sections are hardened and overcoated with a new layer of photoresist. A second pattern is projected onto the second layer of photoresist using conventional techniques. The second pattern is developed so as to create features having dimensions reduced by parts of the dark-band sections previously developed.

23 Claims, 8 Drawing Sheets

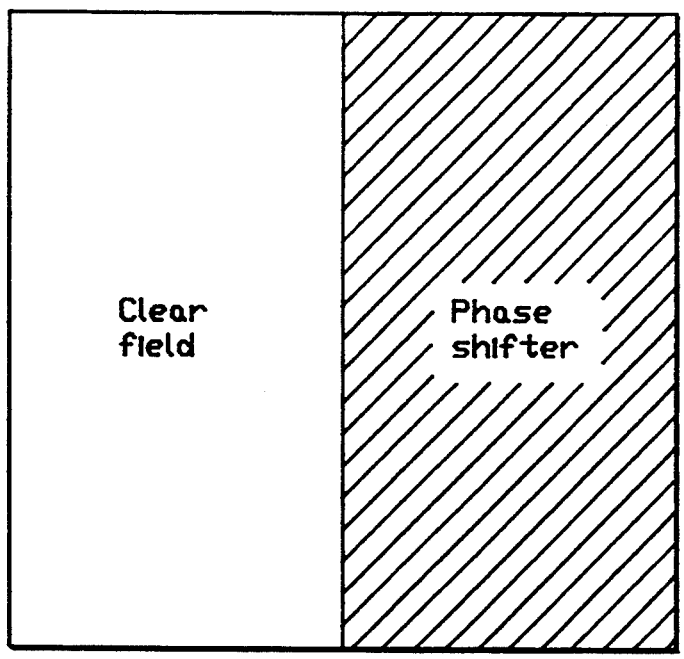
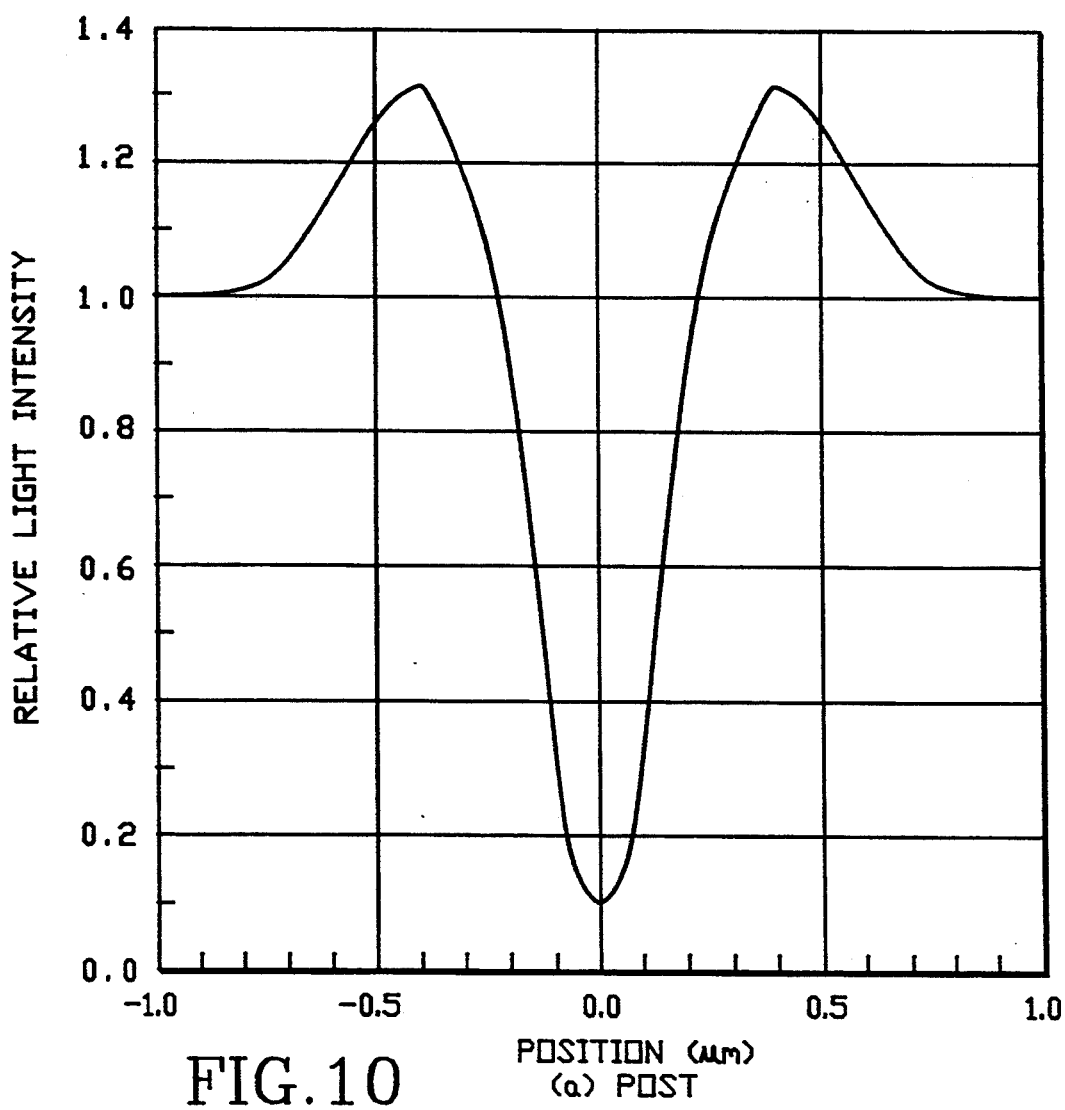
FIG. 10 (a) POST

FIG.10A
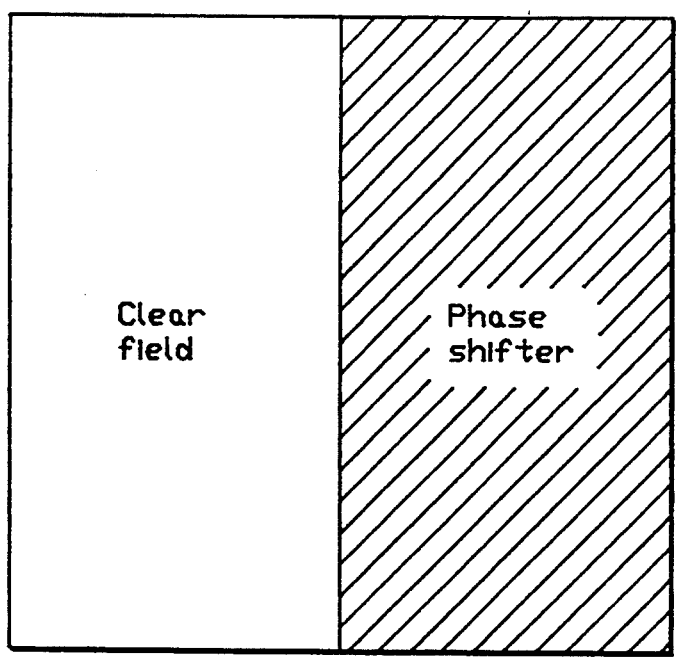
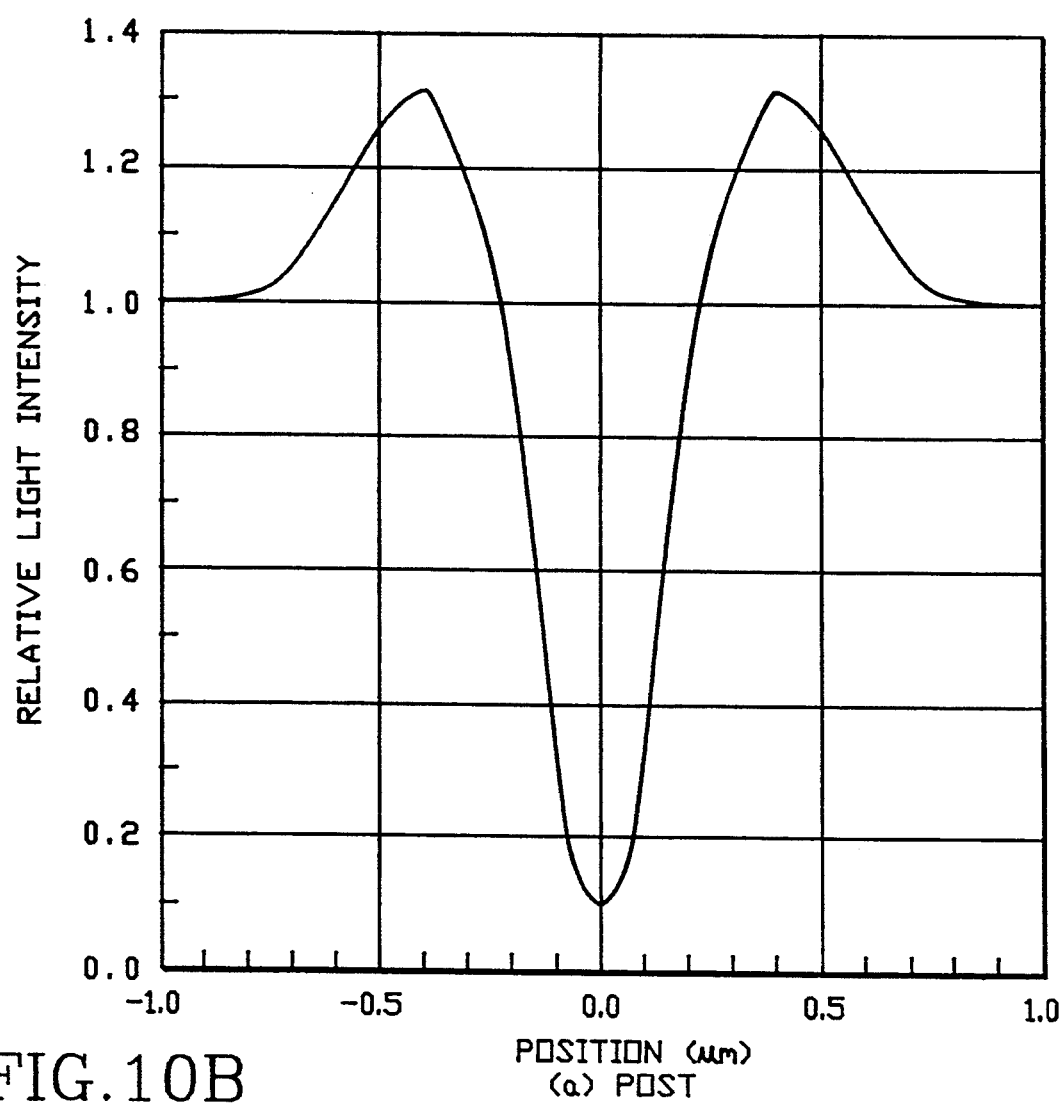
FIG.10B
POSITION (μm)
(a) POST

LITHOGRAPHIC PROCESS FOR PRODUCING SMALL MASK APERTURES AND PRODUCTS THEREOF

BACKGROUND

1. Field of the Invention

The invention relates generally to lithographic image development and resulting products.

The invention relates more specifically to a lithographic process used for fabricating a pattern-defining resist layer on a semiconductor or other substrate where the resist layer is to include apertures of submicron dimensions.

2. Description of the Related Art

Economic mass-production of devices with microscopic features of ever decreasing dimensions has been a long-standing goal of the semiconductor and other arts.

In commercial settings, submicron microscopic features are often defined on a semiconductor or other substrate by way of direct contact masking. A masking layer (e.g., a photoresist layer) is deposited directly onto a substrate surface. A pattern of apertures (windows) is defined through the masking layer using photolithographic development means or other pattern-defining means. The masking layer is then hardened to resist radiation, dopants, etchants, metallization materials, and/or other agents which are to be next applied to the substrate.

When the expected radiation, dopants, etchants, metallization materials, and/or other agents are next applied, they pass selectively through the apertures (windows) of the hardened masking layer and thereby selectively contact and/or alter exposed portions of the underlying substrate surface.

A broad range of uses can be found. In the semiconductor production field, a masking layer with a desired pattern of apertures is useful for, but is not limited to: (1) defining a P-type or N-type conductivity region at an exposed portion of the substrate (e.g. by passing doping agents through the apertures), (2) defining an electrically insulative region at an exposed portion of the substrate (e.g. by exposure to an oxidizing agent), (3) selectively etching away substrate material exposed by the masking layer aperture (e.g. by exposure to an etching agent), (4) developing a metallic contact to the exposed substrate area, and (5) developing a metallic interconnect line which couples one exposed substrate area to another.

Defining openings or apertures through the masking layer is a critical step within the overall process. Lithographic patterning processes are commonly used. The patterning processes can be characterized as two basic kinds; laboratory implementations, and commercially practicable, mass-producible techniques.

There are many proposals to use X-ray or other short wavelength radiations, in a direct-write or stepper-duplicated mode, for defining submicron features either on a resist layer or directly on a substrate. But these techniques are still more in the nature of laboratory implementations, rather than commercially viable techniques.

For the time being, the commercially viable techniques can be said to be those which rely on wavelengths longer than approximately 365 nanometers and on stepper optics.

The relatively long wavelength (0.365 microns or larger) of currently available, commercially viable, photolithographic techniques, imposes a limit on the resolution of a projected image. Conventional photolithographic techniques rely on light in the 436 to 365 nanometer (nm) wavelength regime. These are the wavelengths used respectively by commercially popular G-line and I-line steppers. Conventional G-line steppers produce masking-layer apertures of no smaller than approximately 0.6 microns (600 nanometers) in width or diameter. Conventional I-line steppers produce masking-layer apertures of no smaller than approximately 0.4 microns (400 nanometers) in width or diameter. The minimum aperture size of these aperture-defining technologies place like lower bounds on the width or diameter of each feature created in the underlying substrate.

SUMMARY OF THE INVENTION

The present invention takes advantage of interference between the wavefronts of adjacent light rays to produce mask-openings (e.g. apertures) in which the distance between opposed sidewalls is reduced by an interference-mediated distance. When other factors such as lithography wavelength and resist materials are kept constant, mask-openings created in accordance with the invention are smaller than those created with conventional techniques.

In one embodiment of the invention, a first photo-sensitive resist layer is deposited on a substrate. One or more depressions each having at least one sharply inclined inner wall are defined in the first resist layer. The sharply inclined inner walls of the depressions are dimensioned to create interference between adjacent illuminating wavefronts when the first resist layer is next flood irradiated.

When the first resist layer is next flood irradiated, dark-bands form about the sharply-inclined edges of the .depressions due to interference between adjacent illuminating wavefronts. Dark-band covered portions of the first resist layer behave as if they had not been irradiated. Other portions of the first resist layer, which are not covered by interference-produced dark-bands, respond to the irradiation and become distinguishable from the dark-band covered portions. These other portions are removed, leaving behind the dark-band covered portions.

The dark band portions are then hardened and the substrate is coated with a second layer of resist. The same mask which developed the initial depressions in the first resist layer is used again, in the same position relative to the substrate, to expose the second resist layer.

Apertures are then developed through the second resist layer with the dark-band portions of the first resist layer defining inner walls of the apertures defined through the second resist layer. As a result, aperture size is reduced by part or all of the thickness of the dark-band portions.

The reduced-size apertures are used to selectively expose smaller areas of the underlying substrate to radiation, etchants, dopants, metallization materials and/or other agents.

A masked structure in accordance with the invention comprises: (a) a substrate; (b) dark-band defined portions of a first resist layer disposed on the substrate; and (c) a second resist layer disposed on the substrate, where the second resist layer has apertures defined through it and the dark-band defined portions of a first resist layer define at least part of the inner wall portions of said apertures.

A method in accordance with the invention comprises the steps of: (a) covering a substrate with a first resist layer; (b) irradiating the first resist layer; (c) creating interference-produced dark-bands over preselected portions of the first resist layer; (d) hardening said preselected portions of the first resist layer; (e) covering said substrate with a second resist layer; (f) defining apertures through the second layer in a manner which allows the preselected portions of the first resist layer to define at least a portion of the inner walls of said apertures.

A mask-produced device in accordance with the invention comprises a substrate having features defined by passing radiation, etchants, dopants, metallization materials or other agents through the apertures of the above masked structure and/or method.

BRIEF DESCRIPTION OF THE DRAWINGS

The invention will be described with reference to the following drawings, in which:

FIG. 10 graphs relative light intensity versus displacement from an edge for an ideal phase shifter.

DETAILED DESCRIPTION

Figure 1:
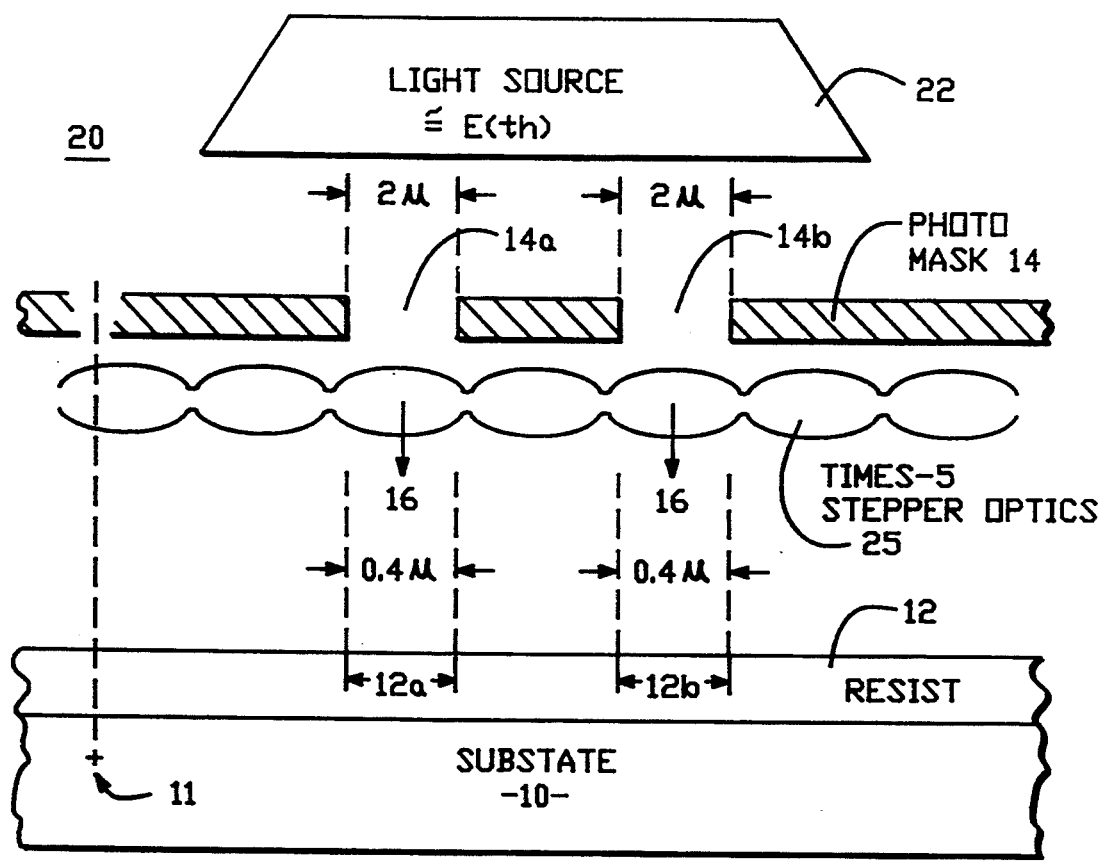
FIG. 1 is a cross sectional view of a stepper in which a first photomask pattern is projected onto a first resist layer.

FIG. 1 shows a cross sectional view of a substrate 10 covered by a first photoresist layer 12. Substrate 10 can be composed of silicon or another suitable material. Resist layer 12 preferably has a planar top surface and is preferably composed of a conventional positive-development photoresist material such as AZ-1350 TM or Shipley Microposit 1400 TM.

The substrate 10 is positioned within a conventional photolithographic stepper unit 20. Examples of such stepper units include the Nikon 1505i7 TM and other such units available from Nikon, Canon, ASM or GCA.

A conventional photomask 14 having apertures 14a and 14b is positioned within stepper unit 20 over the substrate 10 and aligned (registered) to an aligning feature 11 defined on the substrate 10.

A light source 22 within stepper unit 20 flood irradiates the photomask 14 with light energy set equal to or just slightly above the energy threshold level ($E_{th}$) of the resist material 12 and a subsequently used developer (explained later in conjunction with FIG. 2). The light source 22 preferably produces imaging light of wavelengths in the standard 436 nanometers (nm) range or more preferably, the shorter 365 nm range, or any other wavelengths range, that is best accommodated by the characteristics of the available stepper optics and/or lens and the available photolithographic development materials. The stepper optics 25 are interposed between photomask 14 and first resist layer 12 for reducing the image projected onto resist layer 12. (Incidentally, it is to be understood that the invention also contemplates shorter wavelengths, such as for example in the deep ultraviolet (DUV) ranges of 248 nm and 193 nm. These shorter wavelengths are not yet considered commercially viable but are expected to become so because of current efforts in the field to develop DUV-compatible optics and photolithographic development materials.)

In the illustrated example, the radiating source produces 365 nm (0.365 micron) I-line light. Photomask apertures 14a and 14b are each 2 microns wide. The stepper optics 25 provides times-5 reduction, and as a result, exposed regions 12a and 12b of resist layer 12 are each 0.4 microns (400 nanometers) wide.

Light rays 16 are projected throughout mask 14 and stepper optics 25 to expose resist surface areas 12a and 12b.

Because the energy of light rays 16 is set equal to or just slightly above the energy threshold level ($E_{th}$) of the resist material, only the exposed surface portions 12a and 12b convert photochemically into a form that is removable by a next-used developer. Preferably, a lower portion of resist layer 12 remains substantially unconverted. The energy threshold level ($E_{th}$) of the resist material is the minimum level of irradiating energy required for initiating the photochemical conversion process, and it is typically specified by the manufacturer of the photoresist material.

Quite often, the above-mentioned photochemical conversion includes the step of increasing the acidity of the resist material. A high pH solvent such as KOH, NOH or TemAH serves as the developing agent by dissolving away the more acidic portions of the resist material. The amount dissolved away depends on how much conversion took place during the light exposure step of FIG. 1 and on the length of time allowed for the dissolving step.

Figure 2:
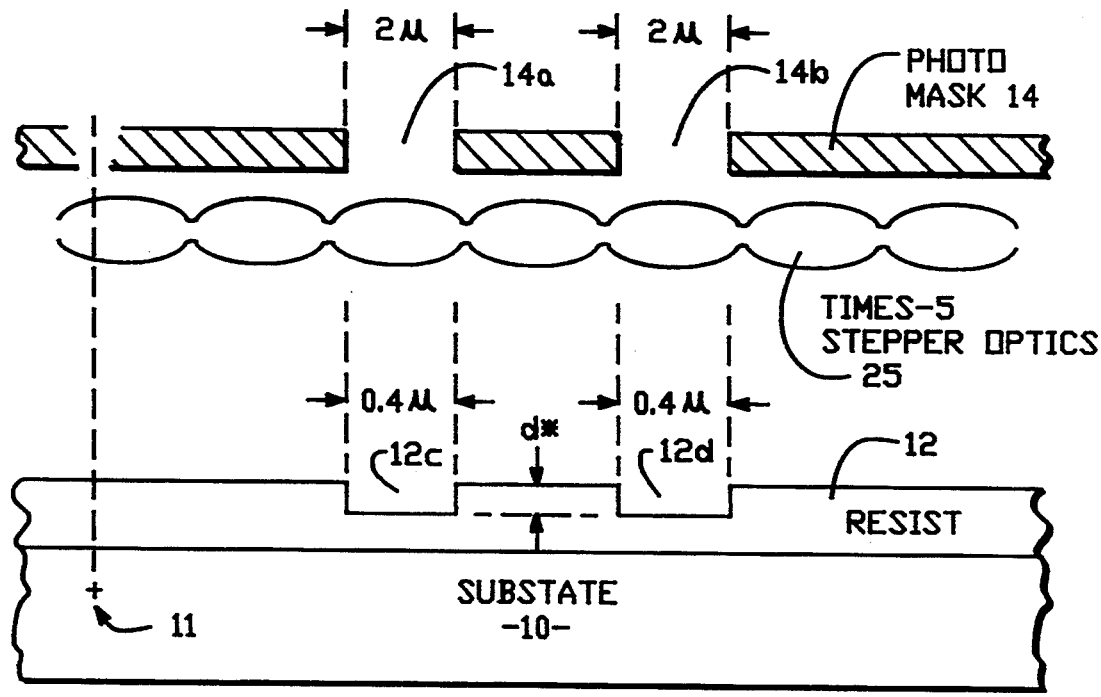
FIG. 2 is a cross sectional view showing depressions formed within the first resist layer.

Exposed resist surface areas 12a and 12b are developed with a suitable developer (e.g. a high pH solvent), leaving behind depressions 12c and 12d, as seen in the cross sectional view of FIG. 2.

To produce the resulting structure of FIG. 2, a positive photoresist developer such as Shipley MF314 TM or AZ-521 TM is applied for a limited time to control the depth of depressions 12c and 12d. The depression depth is set equal or approximately equal to an interference-inducing dimension, d*, where:

$$d^* = (2N+1)/2 \cdot (\lambda/(\eta - 1)) \tag{Eq.1}$$

Figure 3:
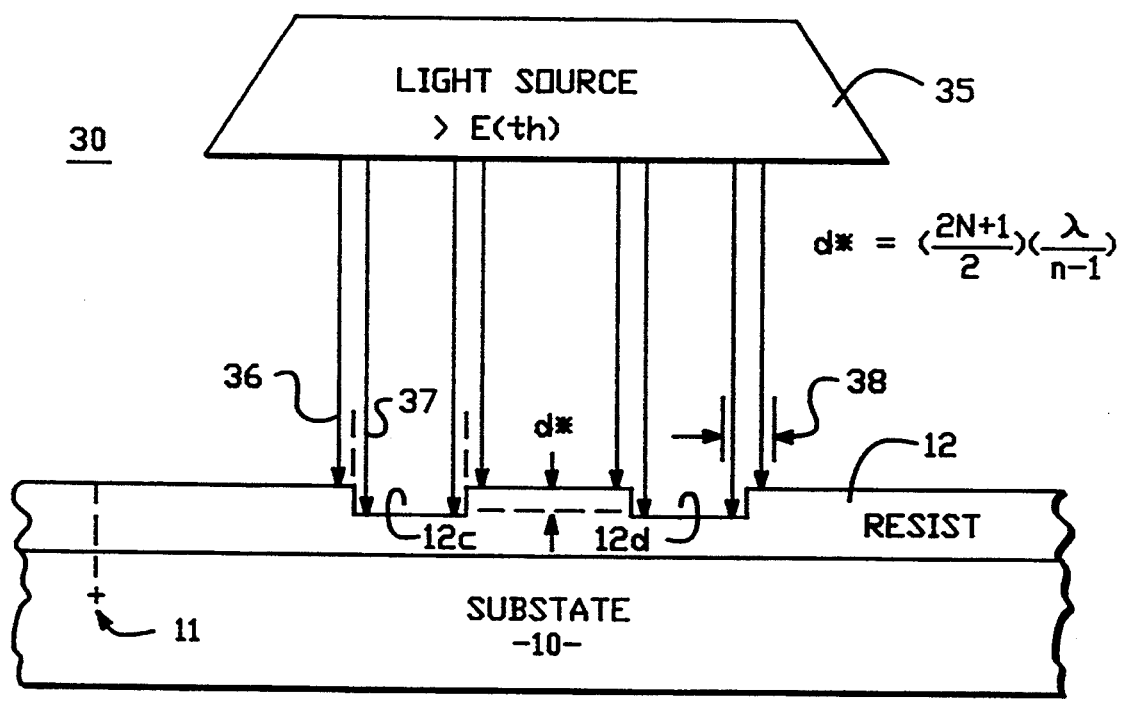
FIG. 3 is a cross sectional view of a flood irradiating apparatus and it shows how interference occurs at the edges of each depression formed in FIG. 2.

In above Eq. 1. λ (lambda) is the wavelength of a flood irradiating light source 35 next used in FIG. 3, η (eta) is the refractive index of resist layer 12, and N is a mode integer selected from the series, 0, 1, 2, 3, . . .

The mode value N=0 is preferred. This minimizes the depression depth d* and the time and materials required for producing such a depth d*. A typical value for the refractive index of resist layer 12 is η=1.64 (e.g.

for the AZ-1350 TM resist). When $\lambda=3650$ Å (I-line in angstroms), $\eta=1.64$, and $N=0$, depression depth d* becomes approximately 2850 Å.

Referring to FIG. 3, the depression-covered structure of FIG. 2 is next placed in a flood irradiating unit 30. Light source 35 flood irradiates the depression-covered resist with light in the appropriate. photoconversion band (e.g. the 436 nm or 365 nm wavelength regions). This time, the energy of light rays 36, 37 is set substantially above the energy threshold level ($E_{th}$) of the resist material to assure conversion down to the surface of the substrate 10. The energy level of the irradiating light 36, 37 should not be set so high, however, that it eliminates the below described interference-mediated mechanism. (Excessive reflections can override the desired dark-band formation described below.)

When the wavefronts of adjacent light rays, 36 and 37, strike respective top and bottom portions of each depression side wall, a phase differential develops. Both of adjacent light rays 36 and 37 travel at the same velocity through a common medium (e.g. air) as they travel from light source 35 to the surface of resist layer 12. But when the irradiating wavefront of light ray 36 strikes the top edge of one of the critically-dimensioned depressions (12c or 12d), it is forced to travel distance d* through the resist material 12, while the irradiating wavefront of light ray 37 continues to travel through the common medium (e.g. air) for distance d* until it reaches the bottom of the depression. Due to the differences of refractive indices between the common first medium (e.g. air) and the second medium (resist 12), the wavefronts are 180° out of phase with one another as they meet at the bottom of the depression, 12c or 12d, and continue to travel downwardly together through the remainder of the resist 12.

Interference occurs as a result of the 180° phase differential. This interference produces unlit or "dark-band" regions 38 around (just below) the edges of the depressions 12c and 12d. The dark-bands 38 are found to be approximately 0.2 microns wide at the 0.365 nm wavelength with the width of each dark-band region 38 being centered at the edge of the corresponding depression edge. It is believed that the dark-band effect arises from a decrease of light energy below the energy threshold level ($E_{th}$) of the resist material 12 in the regions of interference 38. Interference is typically maximum at the sidewalls of depressions 12c and 12d and decays with distance away from the sidewalls. The distances at which light energy rises to equal or exceed the energy threshold level ($E_{th}$) will vary with the use of different resist materials and different illuminating wavelengths and different intensities of illumination. These control factors can be varied to give regions 41–44 widths other than 0.2 micron.

Figure 4:
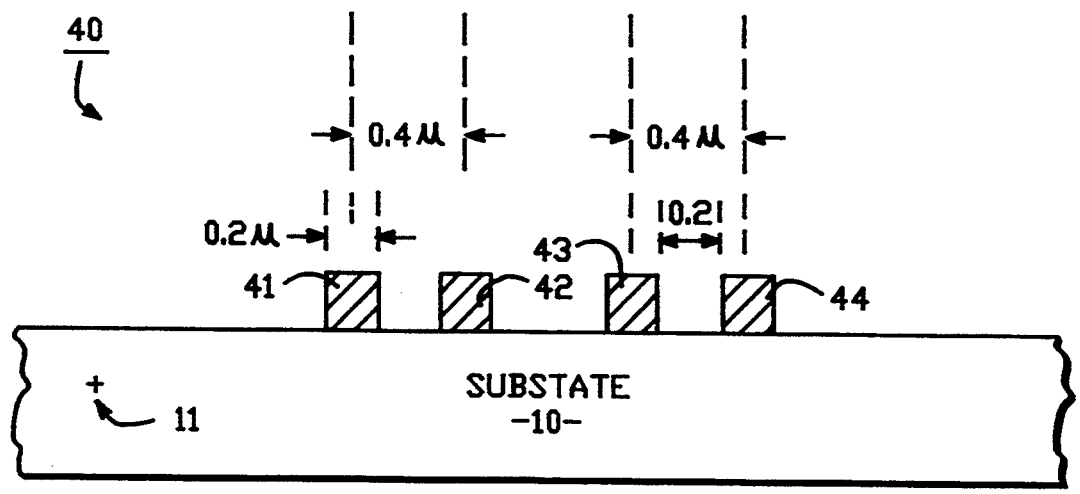
FIG. 4 is a cross sectional view showing the results of development following the flood irradiating step of FIG. 3 and a subsequent hardening step.

In a next step, the flood-irradiated resist of FIG. 3 is fully developed and subsequently hardened (cross-polymerized by exposure to deep ultraviolet radiation) to produce the structure shown in the cross section of FIG. 4. Cross sectional regions 41, 42, 43 and 44 are left behind because they were within dark-band regions 38 in the exposure step of FIG. 3.

It is to be understood that the hardened cross sectional regions 41 through 44 are parts of one or more three-dimensional units. In one embodiment, cross sectional regions 41 and 42 are part of a first tube-shaped unitary piece of hardened resist (e.g., a first doughnut) and cross sectional areas 43 and 44 are part of a second tube-shaped unitary piece of hardened resist (e.g., a second doughnut). Each tube-shaped piece of resist can have a circular shape when viewed from the top, or a rectangular shape, or some other shape.

In another embodiment, cross sectional regions 41, 42, 43 and 44 are spaced apart, parallel strips formed on substrate 10.

Each of cross sectional regions 41–43 is approximately 0.1 to 0.2 microns in width. Their height depends on the height of the first resist layer 12 and the depth of depressions, 12c and 12d, made in FIG. 2. The center-to-center distance between cross sectional regions 41 and 42 is approximately 0.4 microns. (The center lines correspond to the peripheral edges of exposed region 12a in FIG. 1.) The distance between inner walls of cross sectional regions 41 and 42 (or regions 43 and 44) is approximately 0.2 microns. The latter dimension represents the original center-to-center distance (0.4μ) of regions 41 and 42 reduced by the sum of the center to inner-wall widths (0.1μ+0.1 μ) of regions 41 and 42.

The acronym "POST", which stands for Phase-shift 0n Substrate, has been coined for the process of FIGS. 1–4. Phase shifting occurs in the sidewalls of the d* depressions formed directly above the resist-coated substrate. A separate phase-shifting mask is not required to take advantage of the reduced line-widths obtainable through phase-shift technology.

Figure 5:
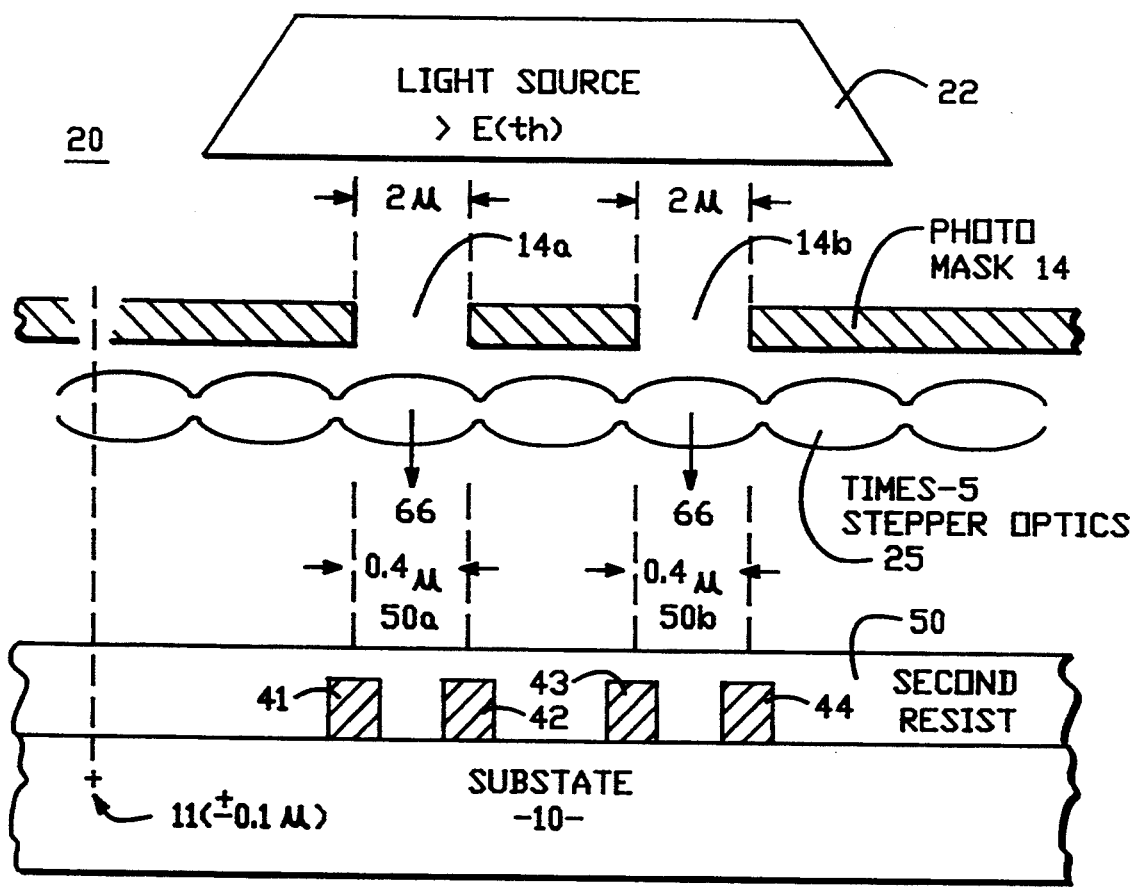
FIG. 5 is a cross sectional view showing a second resist-coating step and subsequent exposure in the stepper of FIG. 1.

Referring to FIG. 5, the hardened resist pieces represented by cross-sectional regions 41–44 are next over-coated with a second photoresist layer 50 as shown. The overcoated structure is returned to the stepper unit 20 of FIG. 1. The same mask 14 used in FIG. 1, is realigned with feature 11 of substrate 10. The alignment tolerance should be less than the smallest center-to inner-wall width or smallest center-to outer-wall width ($\pm 0.1\mu$) of regions 41 through 44.

Light rays 66 are passed through photomask 14 and stepper optics 25 to expose underlying portions, 50a and 50b, of new resist layer 50. Resist layer 50 is a positive development type photoresist which is the same or similar in composition to the first resist layer 12 used in FIG. 1. The light energy of light source 22 is preferably set substantially above the energy threshold level ($E_{th}$) of the resist material 50 to assure complete photochemical conversion down to the surface of substrate 10.

Irradiation within stepper unit 20 is followed by full development, using a positive developer having a composition which is the same or similar to the photo-developer composition used in FIG. 2.

Figure 6:
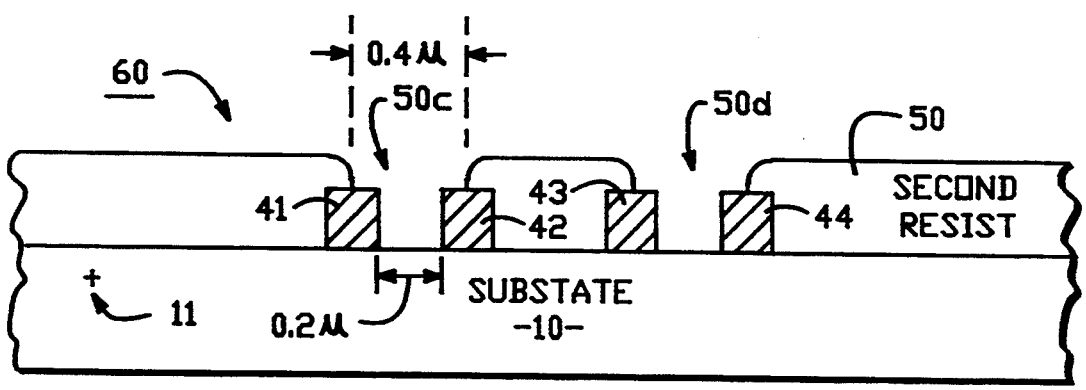
FIG. 6 is a cross sectional view showing a subsequent development step.

FIG. 6 is a cross sectional view of the resulting mask-covered product 60. Unexposed portions of second resist layer 50 remain to cover approximately half the top region at the outer side of dark-band regions 41–44. The inner walls of dark-band regions 41 and 42 are separated by approximately 0.2 microns and they respectively define at least parts of the opposed inner walls of aperture 50c. Aperture 50c corresponds to the 0.4 micron wide area 50a exposed in FIG. 5. (Area 50a does not necessarily have the same top view shape as that of 12a. Mask 14 can be modified between the steps of FIG. 1 and FIG. 5.)

The inner walls of dark-band regions 43 and 44 are separated by approximately 0.2 microns and they define at least part of the inner walls of aperture 50d. Aperture 50d corresponds to the 0.4 micron wide area 50b exposed in FIG. 5.

In a step following that of FIG. 6, developed resist layer 50 is optionally hardened by exposure to deep ultraviolet light. (For some processes, this hardening is not required and can be omitted.) Thereafter, portions of the substrate not masked by layer 50 (optionally-hardened) or hardened dark-band portions 41-44 are exposed to semiconductor dopants, radiation or other characteristic-altering agents. The result is a photolithographically defined product which has features as small as the original center-to-center distance (0.4μ) of regions 41 and 42 reduced by the sum of the center to inner-wall widths (0.1μ+0.1μ) of regions 41 and 42. In the illustrated I-line case, the smallest feature size becomes 0.2 microns. This is 50% less than the conventional 0.4 micron dimension.

Figure 7:
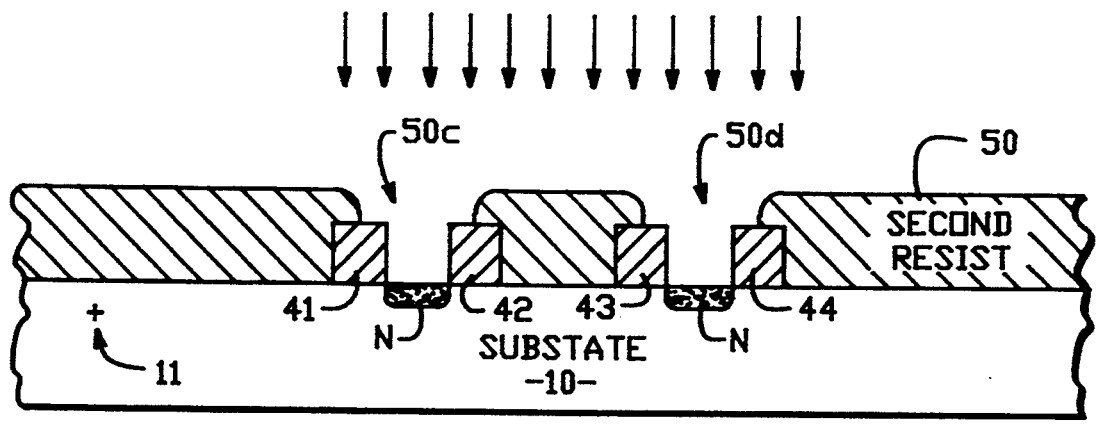
FIG. 7 is a cross sectional view showing a semiconductor device developed using the masked structure of FIG. 6.

FIG. 7 shows one example. Dopants are introduced into substrate 10 by way of the 0.2 micron wide apertures, 50c and 50d, to produce similarly dimensioned N-type conductivity regions in substrate 10. (Substrate 10 is assumed to be silicon or another semiconductor material in this example.)

Figure 8:
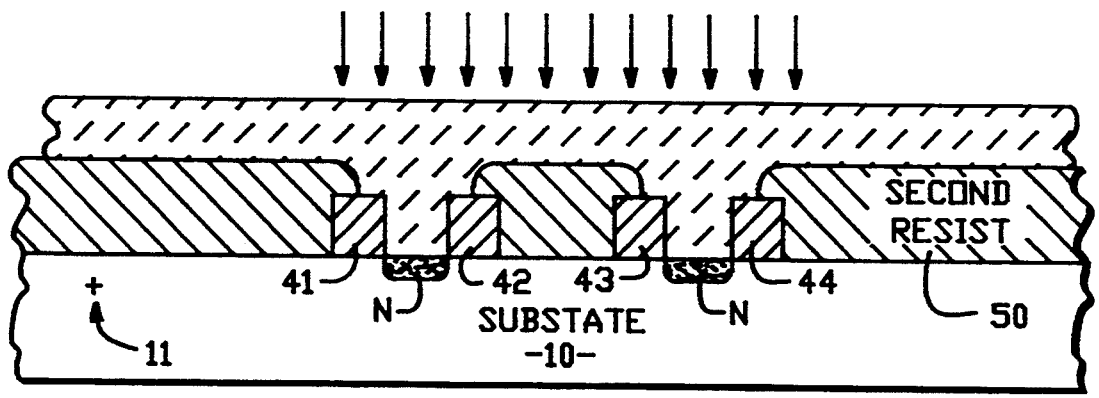
FIG. 8 is a cross sectional view showing another semiconductor device developed using the masked structure of FIG. 6.

FIG. 8 shows another example. A metal (e.g. copper) or other fill material is deposited onto second resist layer 50 to make contact with the substrate 10 at the areas exposed by the 0.2 micron wide apertures, 50c and 50d. Similarly dimensioned N-type conductivity regions are shown to be pre-defined in the substrate 10.

Although a width reduction of only 50%, from 0.4 micron to 0.2 micron, is illustrated in the above I-line example, it should be understood that two-dimensional area decreases as the square of each one dimensional width reduction. An area savings of 75% can be realized therefore for the above example by changing from the 0.16 micron² area (0.4 micron times 0.4 micron) of conventional substrate features to the 0.04 micron² area (0.2 micron times 0.2 micron) for substrate features realized in accordance with the invention. A semiconductor device with more on-chip devices can be constructed through the use of this area savings.

Figure 9A:
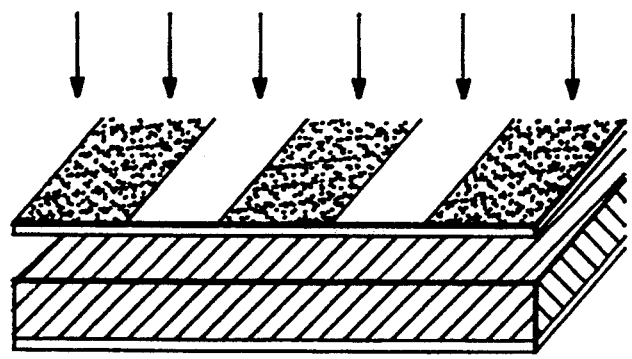
FIGS. 9A-9F show experimental results obtained with 0.5 micron line width masks.
Figure 9B:
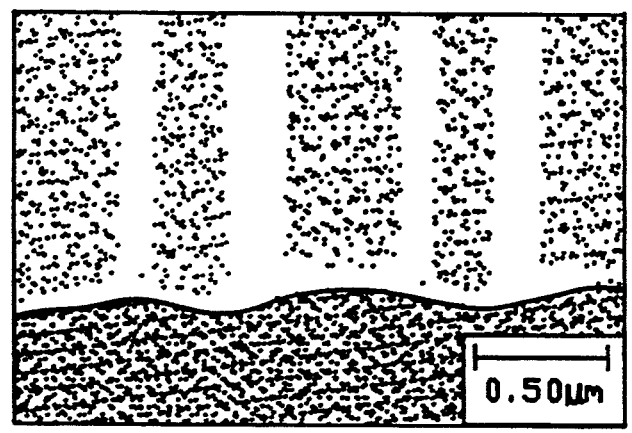
Figure 9C:
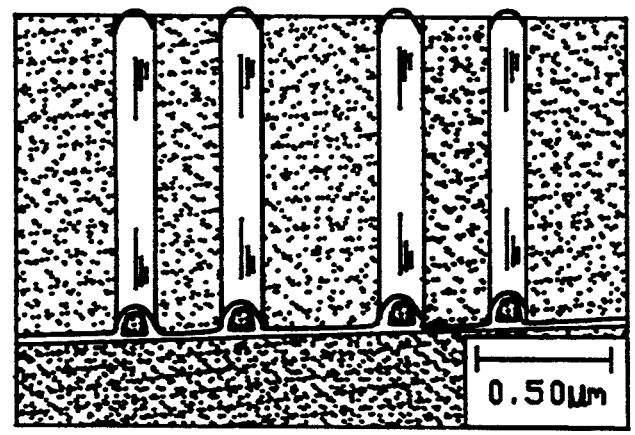
Figure 9D:
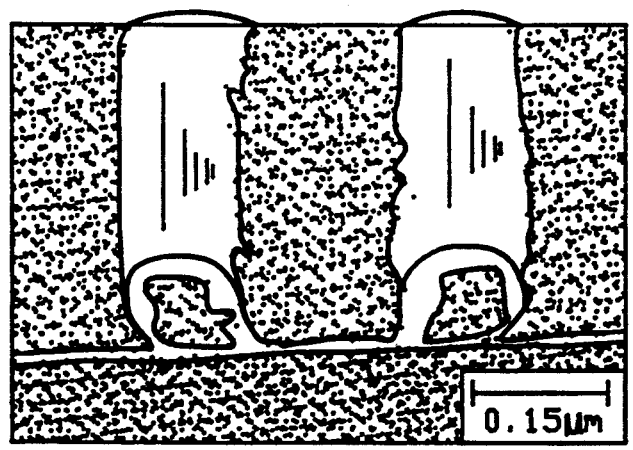

FIGS. 9A through 9F include depictions of structures seen in micrographs of experimental results. FIG. 9A is a perspective view representing first exposure at threshold energy, E(th). A photomask with a projected pattern of alternating 0.5 micron wide opaque-lines and 0.5 micron wide spaces was used in conjunction with a Nikon i-line stepper (NA=0.45, σ=0.5) and Sumitomo Chemical positive photoresist (PFI-15). The d* depressions appear in the edge portion of the photomicrograph depiction of FIG. 9B. The results of subsequent phase-shifting and full development appear in the FIGS. 9C and 9D. As seen in FIG. 9D, the dark-band sections are roughly 0.15 micron wide. As seen in FIG. 9C, two dark-band sections appear within a 0.5 micron wide area, their respective facing walls being approximately 0.25 micron apart. A 0.5 micron space separates each pair of 0.25 micron apart dark-band sections from the next pair.

Figure 9E:
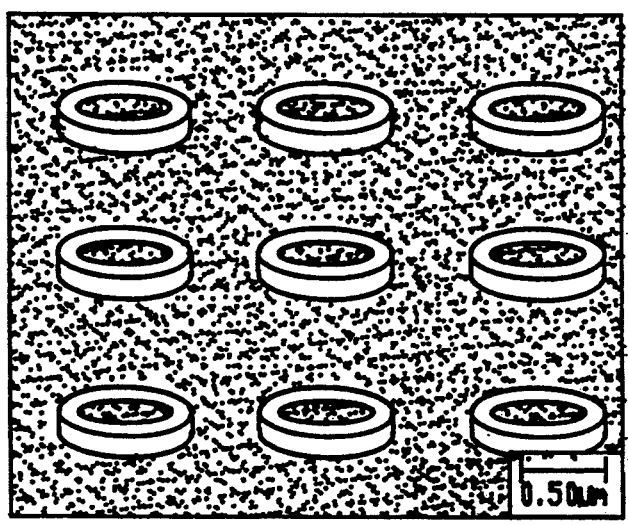
Figure 9F:
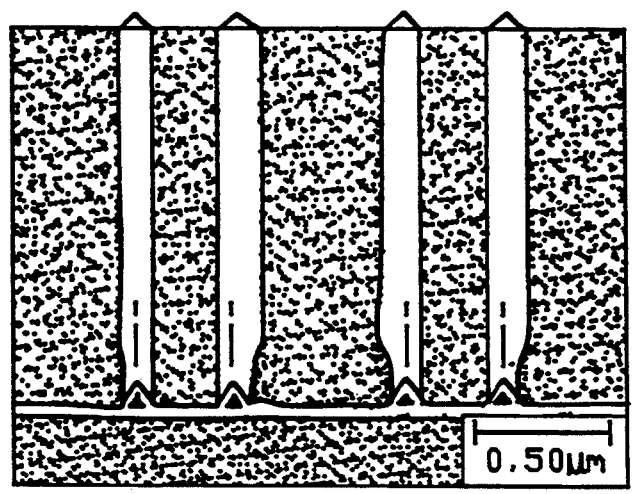

In the photomicrograph depiction of FIG. 9E doughnut-shaped dark-band sections are formed with 0.2 micron width and an aspect ratio of 4. The inside diameter is slightly less than 0.5 micron. In the photomicrograph depiction of FIG. 9F 0.2 micron wide dark-band strips are formed, spaced apart by 0.7 micron. The aspect ratio is 4.

FIG. 10 shows the theoretical light intensity developed by an ideal phase shifter having a height offset of d* at the edge of the depression. The results were obtained with the ALICE computer simulation program. Note that light intensity falls below the 1.0 relative normal in the region of ±0.25 micron away from center. Dark-band section width (e.g. 0.2 micron) is in part a function of this interference-induced reduction in light intensity and it is also a function of the resist chemistry and developer used in the image development steps of FIGS. 3 to 4. A high-contrast resist and developer combination is preferably used to develop dark-band sections with steep side walls. Lower contrast combinations can be used if dark-band sections with less steep (gently-sloping) side walls are desired.

The above disclosure is to be taken as illustrative of the invention, not as limiting its scope or spirit. Numerous modifications and variations will become apparent to those skilled in the art after studying the above disclosure.

By way of example, the phase-shifting upper layer (12) of FIG. 2 can be alternatively formed using two resist layers of different formulations stacked one on the next. The upper resist layer (not shown, call it 12U) would be of thickness d* or slightly less while the thickness of the lower resist layer (not shown, call it 12L) would be selected as desired. Upper resist layer 12U includes a high-speed sensitizer which photo-converts layer 12U to acidic form in relatively short time. Lower resist layer 12L, on the other hand, includes a low-speed sensitizer which photo-converts layer 12L to acidic form over a relatively much longer period of time. The image development step for forming d* depressions 12c, 12d is then carried out in the short time frame of the high-speed sensitizer of upper layer 12U. The upper resist layer 12U is converted to acidic form while the slower-developing lower layer 12L remains substantially unconverted. Subsequent development removes the acidic material of the upper layer 12U (and perhaps a small converted amount of the lower layer 12L) while leaving behind the substantially-unconverted lower layer 12L. The amount of material removed leaves behind depressions 12c,d of depth d*. The refractive index of upper resist layer 12U, incidentally, can be quite different from that of lower resist layer 12L (not shown).

The wavelengths and materials discussed above can be varied as newer technology becomes available to obtain aperture reduction at even smaller dimensions. By way of example, the above technique can be applied to create integrated optic or electro-optic structures on a substrate instead of or in addition to creating integrated electronic structures on a substrate.

Given the above disclosure of general concepts and specific embodiments, the scope of protection sought is to be defined by the claims appended hereto.

What is claimed is:

1. A photo lithographic process comprising the steps of:
    defining phase-shifting edges in a resist layer;
    irradiating the resist layer with light such that interference occurs at the phase-shifting edges thereby producing dark-bands at the phase-shifting edges;
    developing the exposed resist layer so as to leave behind sections covered by the dark-bands;
    hardening the dark-band sections;
    coating the hardened dark-band sections with a second layer of resist material;
    projecting a light pattern onto the second layer of resist material; and
    developing the second layer of resist material.

2. A photo lithographic process according to claim 1 wherein said phase-shifting edges have depths set equal or approximately equal to an interference-inducing dimension, d*, where:

$$d^* = ((2N+1)/2) \cdot (\lambda/(\eta-1)),$$

λ (lambda) is the wavelength of light used in said irradiating step, η (eta) is the refractive index of the resist layer, and N is a mode integer selected from the series, 0, 1, 2, 3, . . . .

3. A masked structure comprising:
   (a) a substrate;
   (b) dark-band defined portions of a first resist layer disposed on the substrate; and
   (c) a second resist layer disposed on the substrate, where the second resist layer has one or more openings defined therethrough and the dark-band defined portions of the first resist layer define at least part of the inner wall portions of said one or more openings.

4. A mask-produced device comprising a substrate having features defined by passing radiation, etchants, dopants, metallization materials or other agents through the one or more openings of the masked structure defined in claim 3.

5. An aperture defining method comprising the steps of:
   (a) covering a substrate with a first resist layer;
   (b) irradiating the first resist layer;
   (c) creating interference-produced dark-bands over preselected portions of the first resist layer;
   (d) removing portions of the first resist layer other than said preselected portions of the first resist layer;
   (e) covering said substrate with a second resist layer such that the preselected portions of the first resist layer are embedded in the second resist layer;
   (f) defining apertures through the second layer in a manner which leaves said preselected portions of the first resist layer defining at least a portion of the inner walls of said apertures.

6. An aperture defining method according to claim 5 wherein said step (c) of creating interference-produced dark-bands over preselected portions of the first resist layer includes defining phase-shifting edges in the first resist layer where the phase-shifting edges have depths set equal or approximately equal to an interference-inducing dimension, d*, where:

$$d^* = ((2N+1)/2) \cdot (\lambda/(\eta-1)),$$

λ (lambda) is the wavelength of light used in said irradiating step (b), η (eta) is the refractive index of the resist layer, and N is a mode integer selected from the series, 0, 1, 2, 3, . . . .

7. An aperture defining method according to claim 5 further including the step of hardening said second resist layer after said step (e) of covering said substrate with a second resist layer.

8. A mask-produced device comprising a substrate having features defined by passing radiation, etchants, dopants, metallization materials or other agents through apertures defined by the method of claim 5.

9. A mask-produced device according to claim 8 where the substrate of the mask-produced device includes a semiconductor material.

10. A method for producing closely spaced apart sidewalls comprising the steps of:
   (a) covering a substrate with a first layer of photosensitive material, where the photosensitive material is characterized by an energy threshold level ($E_{th}$);
   (b) forming spaced-apart interference-creating sidewalls in the first layer of photosensitive material;
   (c) irradiating the first photosensitive layer with light having energy above said energy threshold level ($E_{th}$) such that dark-bands of energy less than said energy threshold level ($E_{th}$) are created by interference in the regions of the interference-creating sidewalls of the first layer of photosensitive material;
   (d) developing the first layer of photosensitive material so as to leave dark-band defined remnants of the first layer of photosensitive material;
   (e) covering said substrate with a second layer of photosensitive material so as to embed the developed first layer remnants in the second layer of photosensitive material; and
   (f) defining apertures through the second layer of photosensitive material in a manner which leaves said remnants of the first resist layer defining respective opposed inner walls of said apertures, where the distance between the opposed inner walls is less than the distance between the spaced-apart interference-creating sidewalls first formed in the first layer of photosensitive material.

11. The method of claim 10 wherein said step (e) of covering includes covering said first layer remnants with the second layer of photosensitive material.

12. The method of claim 10 further comprising, between said step (d) of developing and said step (e) of covering, the step of:
   (d.1) hardening the developed dark-band defined remnants.

13. The method of claim 10 wherein a distance differential defined as the difference between distance between the opposed inner walls and the distance between the spaced-apart interference-creating sidewalls is substantially equal to the extent of the interference-created dark-bands.

14. The method of claim 10
   wherein said step (b) of forming spaced-apart interference-creating sidewalls is carried out using equipment having a predefined minimum resolution; and
   wherein the distance between the spaced-apart interference-creating sidewalls is substantially equal to the predefined minimum resolution;
   whereby said distance between the opposed inner walls is less than the predefined minimum resolution of the utilized equipment.

15. The masked structure of claim 3 wherein the dark-band defined portions are hardened and embedded in the second resist layer.

16. A mask-produced device comprising a substrate having features defined by passing radiation, etchants, dopants, metallization materials or other agents through the one or more openings of the masked structure defined in claim 15.

17. The aperture defining method of claim 5 further comprising the step of:
   hardening said preselected portions of the first resist layer before said step (e) of covering the substrate with the second resist layer.

18. A masked structure comprising:
   (a) a substrate;

(b) remnant portions of a first resist layer disposed on the substrate, the remnant portions remaining after other portions of the first resist layer are removed from the first resist layer; and (c) a second resist layer disposed on the substrate such that the remnant portions of a first resist layer are embedded in the second resist layer, wherein the second resist layer has one or more openings defined therethrough, each opening having an inner wall, and wherein at least one of the remnant portions of the first resist layer defines at least part of the inner wall of said one or more openings.

19. The masked structure of claim 18 wherein the second resist layer is hardened and the remnant portions are hardened prior to and independently of the second resist layer.

20. The masked structure of claim 18 wherein the remnant portions are formed by a Phase-shifting On SubsTrate (POST) process.

21. The masked structure of claim 18 wherein two or more of the remnant portions are spaced apart one from a neighboring other by a distance of 0.2 micron or less.

22. An aperture defining method comprising the steps of:
(a) forming a first resist layer on a substrate;
(b) removing first portions of the first resist layer while leaving behind remnant portions;
(c) hardening the remnant portions;
(d) depositing a second resist layer onto the substrate such that the second resist layer embeds the hardened remnant portions;
(e) defining one or more openings through the second resist layer such that at least one of the remnant portions of the first resist layer defines at least part of an inner wall of said one or more openings.

23. A mask-produced device comprising a substrate having features defined by passing radiation, etchants, dopants, metallization materials or other agents through the one or more openings defined by the method of claims 22.

* * * * *

UNITED STATES PATENT AND TRADEMARK OFFICE
CERTIFICATE OF CORRECTION

PATENT NO. : 5,403,685
DATED : April 4, 1995
INVENTOR(S) : David A. Vidusek et al.

It is certified that error appears in the above-identified patent and that said Letters Patent is hereby corrected as shown below:

Drawing sheet 7 (Fig. 10) should be deleted.
Column 3, line 47, "Fig. 10 graphs" should be --Figs. 10A-10B graph--.
Column 3, line 56, "AZ-1350 TM" should be --AZ-1350J™--.
Column 3, line 57, "1400 TM" should be --1400™--.
Column 3, line 60, "1505i7 TM" should be --1505i7™--.
Column 4, line 53, "MF314 TM" should be --MF314™--.
Column 4, line 54, "AZ-521 TM" should be --AZ-521™--.
Column 5, line 1, "AZ-1350J TM" should be --AZ-1350J™--.
Column 6, lines 21, 22, "Phase-shift On Substrate," should be --Phase-shift On  Substrate,--.
Column 9, line 50, should be --d* = ((2N+1)/2)·($\lambda$/($\eta$-1)),--.
Column 12, line 21, "claims 22" should be --claim 22--.

Signed and Sealed this

Nineteenth Day of March, 1996

Attest:

BRUCE LEHMAN

Attesting Officer          Commissioner of Patents and Trademarks